United States Patent
Brox et al.

(10) Patent No.: US 7,304,515 B2
(45) Date of Patent: Dec. 4, 2007

(54) DEVICE TO BE USED IN THE SYNCHRONIZATION OF CLOCK PULSES, AS WELL AS A CLOCK PULSE SYNCHRONIZATION PROCESS

(75) Inventors: Martin Brox, München (DE); Patrick Heyne, München (DE); Alessandro Minzoni, Morrisville, NC (US); Rajashekhar Rao, München (DE); Kazimierz Szczypinski, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/041,878

(22) Filed: Jan. 25, 2005

(65) Prior Publication Data
US 2005/0179478 A1    Aug. 18, 2005

(30) Foreign Application Priority Data
Jan. 27, 2004  (DE)  ............. 10 2004 004 091

(51) Int. Cl.
*H03L 7/06*    (2006.01)
(52) U.S. Cl. .............. 327/158; 327/156; 327/149

(58) Field of Classification Search ........ 327/156–159, 327/147–150
See application file for complete search history.

(56) References Cited

U.S. PATENT DOCUMENTS

| 4,922,141 | A  | * | 5/1990 | Lofgren et al. | ............. 327/158 |
| 6,388,485 | B2 | * | 5/2002 | Kim | ............. 327/161 |
| 6,556,643 | B2 |   | 4/2003 | Merritt |  |
| 6,946,888 | B2 | * | 9/2005 | Lee | ............. 327/158 |

FOREIGN PATENT DOCUMENTS

EP    1282229 A1    2/2003

* cited by examiner

*Primary Examiner*—Dinh T. Le
(74) *Attorney, Agent, or Firm*—Slater & Matsil, L.L.P.

(57) ABSTRACT

The invention involves a clock pulse synchronization process as well as a device to be used in the synchronization of clock pulses, including a first delay apparatus with variably controllable delay period, in which a clock pulse or a signal derived from it, has a variably controllable delay period imposed on it and is then emitted as a delayed signal. In addition to the first delay apparatus with variably controllable delay period, a second delay apparatus with variably controllable delay period is provided.

15 Claims, 2 Drawing Sheets

DEVICE TO BE USED IN THE SYNCHRONIZATION OF CLOCK PULSES, AS WELL AS A CLOCK PULSE SYNCHRONIZATION PROCESS

CLAIM FOR PRIORITY

This application claims priority to German Application No. 10 2004 004 091.5 filed on Jan. 27, 2004.

TECHNICAL FIELD OF THE INVENTION

The invention relates to a device to be used in the synchronization of clock pulses, as well as a clock pulse synchronization process, and in particular to a device to be used for synchronizing a clock pulse used internally in a memory chip with a clock pulse entered externally into the memory chip, as well as a clock pulse synchronization process.

BACKGROUND OF THE INVENTION

With semi-conductor components, in particular memory components such as DRAMs (DRAM=Dynamic Random Access Memory and/or dynamic read-write memories—e.g. based on CMOS technology—so-called clock pulses are used for the chronological coordination of the processing and/or relaying of data.

With conventional semi-conductor components a single clock pulse (i.e. a so-called "single ended" clock pulse)—present on a single line—is used).

The data can then for instance be relayed during each ascending pulse flank of the single clock pulse (or alternatively for instance during each descending single clock pulse flank).

Furthermore, in current technology so-called DDR components, in particular DDR-DRAMs (DDR-DRAM=Double Data Rate DRAM and/or DRAM with a double data rate), are already well known.

With DDR components—instead of a single clock pulse ("single ended" clock pulse) present on a single line—two differentiated, reciprocally inverse clock pulses present on two separate lines are used.

Every time, for instance when the first of the two clock pulses changes its state from "high logic" (e.g. a high voltage level) to a state of "low logic" (e.g. a low voltage level), the second clock pulse—essentially simultaneously—changes its state from "low logic" to "high logic" (e.g. from a low to a high voltage level).

Conversely, whenever the first clock pulse changes its state from "low logic" (e.g. a low voltage level) to a state of "high logic" (e.g. a high voltage level), the second clock pulse (again essentially simultaneously) changes its state from "high logic" to "low logic" (e.g. from a high to a low voltage level).

In DDR components, data is usually relayed during the ascending flank of the first clock pulse, as well as during the ascending flank of the second clock pulse (and/or also during the descending flank of the first clock pulse, as well as during the descending flank of the second clock pulse).

Therefore, data in a DDR component is relayed more frequently and/or faster (in particular twice as frequently, and/or twice as fast) as in corresponding conventional components with single—and/or "single ended"—clock pulses—i.e. the data rate is higher, in particular twice as high as in corresponding conventional components.

The—internal—clock pulse ("DQS" and/or "data strobe" signal and/or—where differentiated, reciprocally inverse clock pulses are used—the internal clock pulse DQS and the clock pulse BDQS, reciprocally inverse to the clock pulse DQS used in the component for the chronological coordination of the processing and/or relaying of data, must be applied synchronously with an external clock pulse ("CLK" and/or "clock" signal) and/or synchronously with a differentiated clock pulse CLK, BCLK, externally entered into the component).

The external clock pulses CLK, BCLK are generated by an appropriate external clock pulse generator connected to the component.

In order to synchronize the internally generated clock pulse DQS and/or the internally generated clock pulses DQS, BDQS with the external clock pulses CLK, BCLK, a clock pulse synchronization apparatus, e.g. a DLL circuit (DLL=Delay Locked Loop) is used. Such a circuit is known from EP 964 517 for instance.

A clock pulse synchronization apparatus may for instance contain a first delay facility ("delay chain"), into which the external clock pulses CLK, BCLK are entered, and which—depending on a control signal emitted by a phase comparator—applies a variable delay period $t_{var}$—adjustable by the control signal—to the entered clock pulses CLK, BCLK.

The delay period $t_{var}$ is for instance variable between a certain minimum delay period $t_{var,min}$ (which may be equal to or approximately equal to zero), and a particular maximum delay period $t_{var,max}$.

The signal(s) emitted by the first delay apparatus can then be used—internally—in the component for the chronological co-ordination of the processing and/or relaying of data (i.e. as the—internal—clock pulse(s) DQS and/or BDQS).

The signal DQS emitted by the first delay apparatus is relayed to a second delay apparatus ("clock tree delay mimic"), which applies a—fixed—delay period $t_{const}$ to the entered signal DQS corresponding approximately to the sum total of the signal delays caused by the receiver ("receiver delay"), and/or each data path ("data path delay") and/or the off-chip driver ("OCD delay").

The signal (FB signal and/or "feedback signal" emitted by the second delay apparatus) is relayed to the above phase comparator apparatus, where the phase status of the FB signal is compared with that of the CLK signal (similarly entered into the phase comparator apparatus). Depending on whether the phase of the FB signal precedes that of the CLK signal or trails behind it, an increasing signal (INC signal) or decreasing signal (DEC signal) is emitted by the phase comparator apparatus as control signal for the above first delay apparatus, which causes the delay $t_{var}$ of the CLK signal, imposed by the first signal delay apparatus—in case of an INC signal—to be increased, and/or—in case of a DEC signal—to be reduced so that the CLK and the FB signals are synchronized, i.e. so that the clock pulse synchronization apparatuses are "locked".

The frequency of the clock pulses (CLK, BCLK) entered into the component and/or the DLL circuit (e.g. as laid down in the corresponding specification of the semi-conductor component) should if possible not be changed—particularly when the DLL circuit is in an "unlocked" state.

In particular, when the frequency of the clock pulses (CLK, BCLK) entered into the component and/or the DLL circuit is—nevertheless—changed (e.g., to conserve energy, when booting up the system, etc.) the delay period $t_{var}$ may be changed to such an extent during the synchronization process caused by the first delay apparatus ("delay chain"), that the delay period can approach its upper or lower limits (e.g. the lower limit—e.g. the zero delay $t_{var,min}=0$—, or e.g. the upper limit ($t_{var,max}$)—amounting to the maximum number of delay units).

SUMMARY OF THE INVENTION

The invention discloses a device to be used in the synchronization of clock pulses, as well as a novel clock pulse synchronization process, in particular a device and a process, with which the limitations of current corresponding devices and/or processes can be at least partially overcome.

In one embodiment of the invention, there is a device to be used in the synchronization of clock pulses is made available, having a first delay apparatus with a variably controllable delay period, in which an entered clock pulse—or a signal derived from it—is endowed with a variably controllable delay period and emitted as a delayed signal, wherein in addition to the first delay apparatus with variably controllable delay period, a second delay apparatus with variably controllable delay period is provided.

Advantageously, when the signal delay period imposed by the first or second delay apparatus exceeds a particular critical value—or falls below it—the signal delay period caused by the respective delay apparatus (of which the output signal for instance is used as a clock pulse, in particular one used for the chronological co-ordination of the processing and/or relaying of data) is—at least temporarily—left unchanged (and the signal delay period imposed in each case by the other delay apparatus—whose output signal is for instance (simply) used as a back-connected signal for the device—is varied stepwise).

BRIEF DESCRIPTION OF THE DRAWINGS

The invention is more closely described by means of the embodiment examples and attached illustrations. In the illustrations.

DETAILED DESCRIPTION OF THE INVENTION

Figure 1:
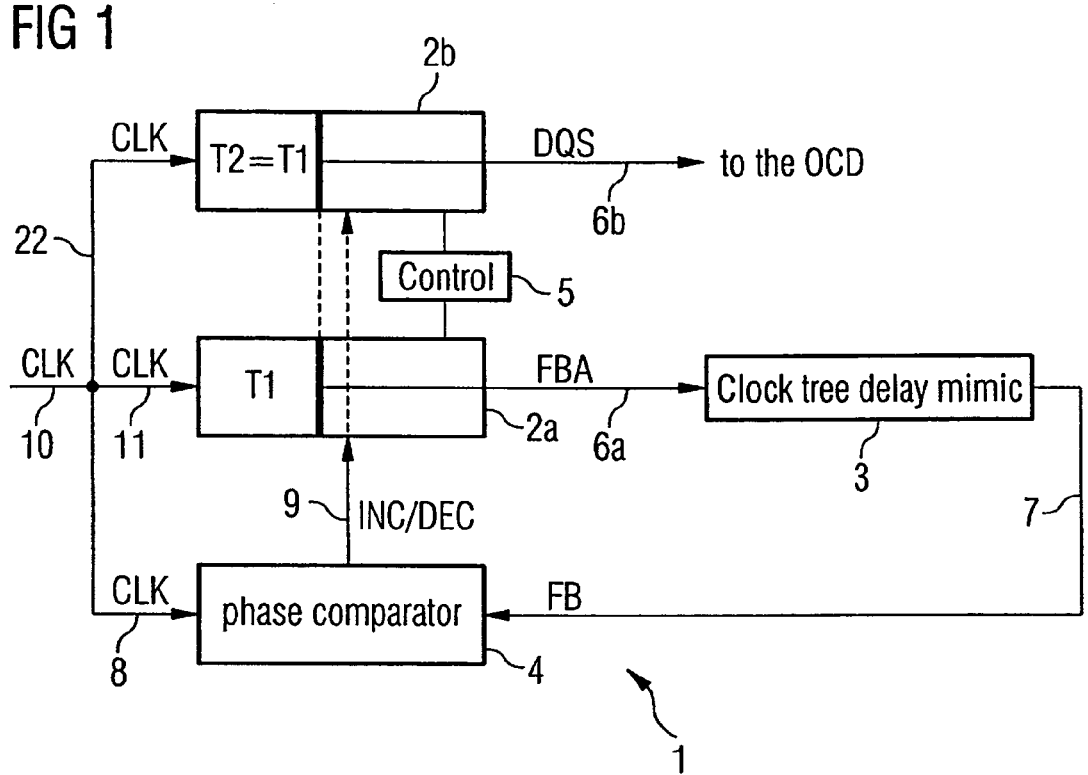
FIG. 1 shows a schematic representation of a clock pulse synchronization apparatus in terms of an embodiment example of the invention at a first state of the clock pulse synchronization apparatus.

FIG. 1 shows a schematic representation of a clock pulse synchronization apparatus 1 in terms of an embodiment example of the invention (in fact in a first state—e.g. in the state of the clock pulse synchronization apparatus 1 present directly after switching on and/or directly before booting ("pre-synchronization phase")).

The apparatus has—correspondingly similar to conventional clock pulse synchronization apparatuses—a first delay apparatus 2a ("delay chain"), capable of causing a variably adjustable signal delay, as well as a further delay apparatus 3, capable of causing a fixed pre-set delay ("clock tree delay mimic"), and a phase comparator apparatus 4 ("phase comparator").

Furthermore the clock pulse synchronization apparatus 1 shown in FIG. 1—in contrast to conventional clock pulse synchronization apparatuses—also has, apart from the above first delay apparatus 2a imposing a variably adjustable signal delay, (as is more closely described below), a second apparatus 2b ("delay chain") similarly able to impose a variably adjustable signal delay, as well as a specially adapted control device 5, to be used for controlling the clock pulse synchronization process—in particular for controlling the two delay apparatuses 2a, 2b (operating in parallel).

The clock pulse synchronization apparatus 1 can for instance be provided at a semi-conductor component, in particular a memory component such as a for example a DRAM (DRAM=Dynamic Random Access Memory and/or dynamic read-write memory), a DDR-DRAM (DDR-DRAM=Double Data Rate DRAM and/or DRAM with double date rate), for instance one based on CMOS technology.

The corresponding semi-conductor component has an—external—connection (e.g. a corresponding pad and/or corresponding pin), to which an external clock pulse CLK—from a external clock pulse generator—is applied for the chronological co-ordination of the processing and/or relaying of data in the semi-conductor component.

Alternatively the component can include a corresponding—further—external connection (e.g. a corresponding further pad and/or corresponding further pin), to which a clock pulse BCLK, inverted in relation to above clock pulse CLK, is applied (i.e. so-called "differentiated" clock pulses CLK or BCLK can then be used).

Inside the component, the data can then for instance be relayed during the ascending (or alternatively for instance during the descending) pulse flank of the clock pulse CLK (and/or—more accurately—an internal DQS clock pulse derived from it), and/or—when differentiated clock pulses CLK and BCLK (and/or—more accurately—the differentiated internal clock pulses DQS and BDQS derived from it) are used—usually during both the ascending flank of the CLK and the ascending flank of the BCLK clock pulse (and/or during both the ascending flank of the DQS and the ascending flank of the BDQS signal (and/or during each descending pulse flank of the corresponding signal)).

As shown in FIG. 1, the CLK signal—present at the corresponding connection of the semi-conductor component—is fed via a line 10 and a line 11 connected to it, to the first delay apparatus 2a provided in the clock pulse synchronization apparatus 1, as well as to the additionally provided second delay apparatus 2b—via the above line 10 and a line 22 connected to it.

In the first and second delay apparatuses 2a, 2b ("delay chains" and/or "delay lines")—during the first state of the clock pulse synchronization apparatus 1 ("first synchronization phase") shown in FIG. 1—the CLK signal, depending on control signal INC and/or DEC emitted by the phase comparator apparatus 4, has a (variable) delay period $t_{var}$—adjustable by means of the control signal—imposed on it (whereby—in the first state of clock pulse synchronization apparatus 1—(and for instance controlled by the above control device 5) the delay period $t_{var}$ (here: $t_{var}$=T1) caused by the first delay apparatus 2a, is in each case identical to the delay period $t_{var}$ (here: $t_{var}$=T2) caused by the second delay apparatus 2b (i.e., in the first state of the clock pulse synchronization apparatus 1, it therefore follows that T1=T2)).

Thereby the delay period $t_{var}$ is variable, for instance between a particular minimum delay period $t_{var,min}$ (which may also for instance be equal to or approximately equal to zero), and a particular maximum delay period $t_{var,max}$.

With this embodiment example, a signal DQS (and/or additionally a signal BDQS, inverted in relation to it)

emitted by the second delay apparatus 2b to a line 6b—and delayed in relation to the CLK signal by the above variable delay period $t_{var}$—is simply used internally in the component for the chronological co-ordination of the processing and/or relaying of data, and/or for relaying it to Off-Chip Drivers (OCDs) (i.e. as the—internal—clock pulse(s) DQS and/or BDQS)—not so however the signal FBA emitted by the first delay apparatus 2a on line 6a—and similarly delayed in relation to the CLK signal by the above variable delay period $t_{var}$ (and at the first state of the clock pulse synchronization apparatus 1 identical to the signal DQS emitted by the second delay apparatus 2b).

The BDQS signal can then be generated from the signal DQS emitted by the second delay apparatus 2b—for instance by being inverted—or can for instance be separately generated (for instance from the BCLK signal, by using a clock pulse synchronization apparatus corresponding to the clock pulse synchronization apparatus 1 shown in FIG. 1).

As is further apparent from FIG. 1, the signal FBA emitted by the first delay apparatus 2a to the above line 6a, is relayed to the above further delay apparatus 3 ("clock tree delay mimic")—i.e. back-connected—(but not so however the signal DQS emitted by the second delay apparatus 2b to line 6b).

In the further delay apparatus 3, the signal FBA entered into it is has a—fixed—delay $t_{const}$ imposed on it, which approximately corresponds to the total signal delay caused by the receiver ("receiver delay"), each data path ("data path delay"), and the off-chip driver ("OCD delay").

The signal (FB signal and/or "feedback signal") emitted by the further delay apparatus 3—and delayed in relation to the FBA signal by the above fixed delay period $t_{const}$—is fed to a first input of the phase comparator apparatus 4 via a line 7.

As is further apparent from FIG. 1, the CLK signal present on line 10 is fed—via a line 8 connected to a line 10—to a (further) input of the phase comparator apparatus 4.

In the phase comparator apparatus 4—correspondingly similar to conventional phase comparator apparatuses—the phase status of the FB signals—present on line 7 and fed to the first input of the phase comparator apparatus 4—is compared with that of the CLK signal—present on line 8 and fed to the further input of the phase comparator apparatus 4.

Depending on whether the phase of the FB signal precedes or trails behind that of the CLK signal, the phase comparator apparatus 4 emits an increasing signal (INC signal), or a decreasing signal (DEC signal)—as control signal for the above first and second delay apparatus 2a, 2b—to a control line 9 connected to the first (and where appropriate also to the second) delay apparatus 2a, 2b (and/or to the above control device 5)—e.g. a "high logic" signal as INC signal, and a "low logic" signal as DEC signal (or the other way round)).

As long for instance as a positive flank of the FB signal precedes that of a corresponding positive flank of the CLK signal, an INC signal is emitted by the phase comparator apparatus 4 to line 9 as control signal for the above first and second delay apparatus 2a, 2b (and/or the above control device 5).

In contrast, in the event that each positive flank of the FB signal trails behind the corresponding positive flank of the CLK signal, a DEC signal is emitted by the phase comparator apparatus 4 to line 9 as control signal for the above first and second delay apparatus 2a, 2b.

The INC signal—emitted when the FB signal precedes the CLK signal—causes the delay $t_{var}$ of the CLK signal, imposed by the first signal delay apparatus 2a—at the above first state of clock pulse synchronization apparatus 1—as well as the delay $t_{var}$ of the CLK signal imposed by the second signal delay apparatus 2b, to be correspondingly (and constantly) increased (e.g. at the first signal delay apparatus 2a initially from T1 to T1', then to T1'', etc., and at the second signal delay apparatus 2b initially from T2 to T2', then to T2'', etc.) and in fact to the same extent (so that—at each of the corresponding times—the following applies: T1'=T2', T1''=T2'', etc.)).

In this way, it can be achieved that the FB signal (and/or its positive (and negative) pulse flanks) precedes the CLK signal (and/or its corresponding positive (and negative) pulse flanks) by a constantly diminishing interval.

In correspondingly inverse fashion, the DEC signal—emitted when the FB signal trails behind the CLK signal—causes the delay $t_{var}$ of the CLK signal imposed by the first signal delay apparatus 2a, as well as the delay $t_{var}$ of the CLK signal imposed by the second signal delay apparatus 2b to be correspondingly (and constantly) decreased—during the above first state of the clock pulse synchronization apparatus 1—(e.g. at the first signal delay apparatus 2a initially from T1 to T1''', then to T1'''', etc., and at the second signal delay apparatus 2b initially from T2 to T2''', then to T2'''', etc.) (and in fact to the same extent in each case (so that—at each of the corresponding times—the following applies: T1'''=T2''', T1''''=T2'''', etc.)).

In this way it is achieved that the FB signal (and/or its positive (and negative) pulse flanks) trails the CLK signal (and/or its corresponding positive (and negative) pulse flanks) by a constantly diminishing interval.

In an ideal case—even before the delay period $t_{var}$ caused by first and second delay apparatus 2a, 2b is increased and/or decreased to such an extent that it reaches its upper or lower limit (for instance the—zero delay unit $t_{var,min}=0$—lower limit, or for instance the—maximum number of delay units—upper limit ($t_{var,max}$)) (i.e. even during the first state of the clock pulse synchronization apparatus 1 ("first synchronization phase") shown in FIG. 1), the CLK and the FB and/or DQS signals are synchronized, i.e. the clock pulse synchronization apparatus 1 is "locked".

In the "locked" state ("locked phase") the CLK signal always shows a positive flank at the same time as the FB signal (and/or the CLK signal always shows a negative flank at the same time as the FB signal).

Especially when the frequency of the clock pulse (CLK) input into the component and/or the clock pulse synchronization apparatus 1 is changed—if needed, contrary to that component's specifications, and if needed, relatively extensively (e.g. to save energy, when the system is booted up, etc.) the delay period $t_{var}$ imposed by the first and second delay apparatus 2a, 2b may, during the above "first synchronization phase", be varied to such an extent that it reaches its upper or lower limits (for instance e.g. the—zero delay unit $t_{var,min}=0$—lower limit, or e.g. the—maximum delay unit number—upper limit ($t_{var,max}$))—even before the CLK and the FB signal have been synchronized, i.e. before the clock pulse synchronization apparatus 1 is in the above "locked" state.

Figure 2:
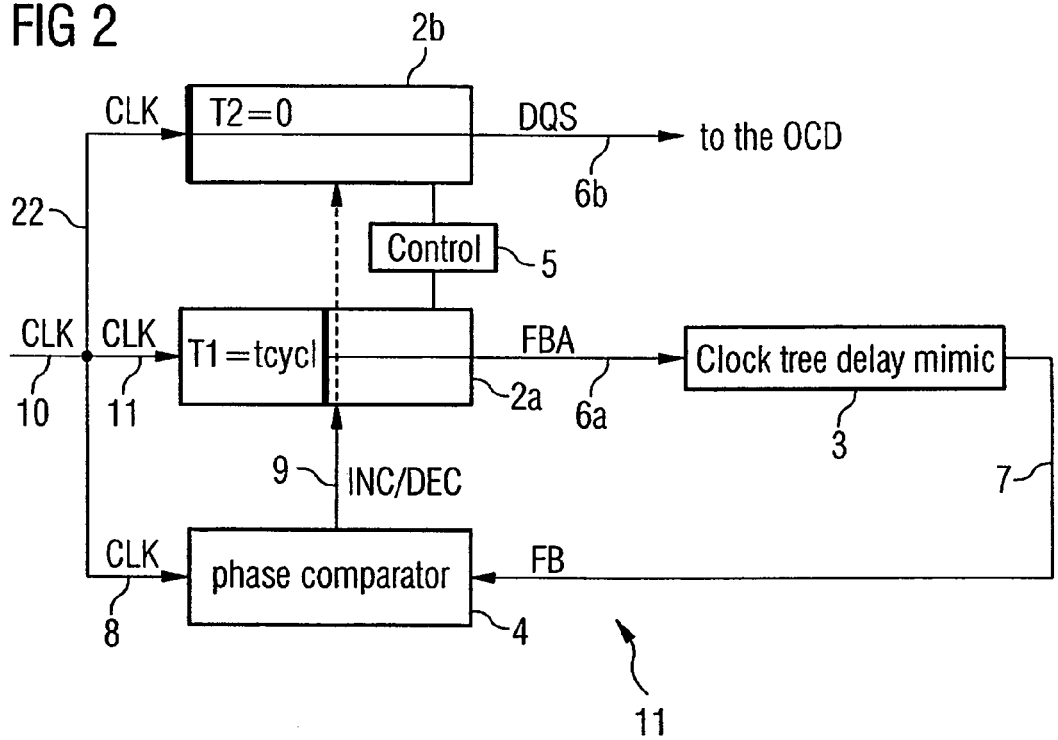
FIG. 2 shows a schematic representation of the clock pulse synchronization apparatus shown in FIG. 1 at a second state of the clock pulse synchronization apparatus.

If it is then caused—e.g. by the above control device 5—that the delay period imposed by the first and second delay apparatus 2a, 2b, reaches the above lower or upper limit, it is caused (e.g. by the above control device 5) that the clock pulse synchronization apparatus 1 is moved away from the above first state ("first synchronization phase"), as shown in FIG. 1, to a second state ("second synchronization phase") different to this (cf. FIG. 2).

In this state—as shown in FIG. 2—the second delay apparatus 2b—regardless of the INC or DEC signal generated by the phase comparator apparatus 4 and present on line 9—at first remains in the last state it achieved (i.e. the delay period of the second delay apparatus 2b is (at first) not changed further (i.e. it remains at the above—last achieved—upper and/or lower limit (e.g. at the lower limit—e.g. amounting to a zero delay unit $t_{var,min}=0$—or e.g. at the upper limit ($t_{var,max}$) amounting to the maximum number of delay units.))

Furthermore—and as also shown FIG. 2—(e.g. under the control of the above control device 5) the delay period $t_{var}$ generated by the first delay apparatus 2a is varied in steps, in other words, when the lower delay period limit $t_{var,min}$ i.e. reached, it is stepped up (e.g. by $+\Delta t$), and/or upon reaching the upper delay period limit $t_{var,max}$ stepped down (e.g. by $-\Delta t$). The stepwise increasing and/or decreasing of the delay period $t_{var}$ can for instance take place shortly after a corresponding positive (or negative) flank of the FBA (and/or DQS, or CLK or FB) signal (in particular for instance shortly after the CLK and FB signals have changed over into the same signal state).

Advantageously, the extent of the increase and/or decrease of the delay period $t_{var}$ imposed by the first delay apparatus 2a will approximately correspond to the cycle period tcycl of the CLK (and/or FBA, DQS, or FB) signal—i.e. the time elapsed between two positive and/or two negative pulse flanks of the corresponding signal (or a multiple thereof)—the delay period $t_{var}$ imposed by the first delay apparatus 2a then for instance (when the lower delay period$_{var,min}$ limit is reached) amounts to n×tcycl (e.g. tcycl), or for instance (when the upper delay period limit is reached) $t_{var,max}$—n×tcycl (e.g. $t_{var,max}$—tcycl).

Alternatively and/or advantageously, the delay period $t_{var}$ imposed by the first delay apparatus 2a is changed in such a way that it falls approximately halfway between the maximum values ($t_{var,min}$ and $t_{var,max}$). Advantageously and/or alternatively the first delay apparatus 2a can also be returned to the initial condition existing before the start of the above "first synchronization phase".

As already explained above, an INC signal is emitted by the phase comparator apparatus 4 on line 9—for as long as for instance each positive flank of the FB signal precedes the corresponding positive flank of the CLK signal. In contrast—as has also been explained above as well—where the positive flank of the FB signal trails behind the positive flank of the CLK signal, a DEC signal is emitted by the phase comparator apparatus 4 on line 9.

The INC signa—emitted in response to the FB signal preceding the CLK signal—causes—in the second state of the clock pulse synchronization apparatus 1 ("second synchronization phase", FIG. 2) the delay $t_{var}$ of the CLK signal—imposed by the first signal delay apparatus 2a (not however the delay of the CLK signal imposed by the second signal delay apparatus 2b), to be correspondingly (and steadily) increased (e.g. from T1=$t_{var,max}$—tcycl to T1''''', etc.)—the delay $t_{var}$ imposed by the second signal delay apparatus 2b remains constant (e.g. at T2=$t_{var,max}$)).

This causes the FB signal (and/or its positive (and negative) pulse flanks) to precede the CLK signal (and/or its corresponding positive (and negative) pulse flanks) less and less.

Correspondingly the DEC signal—emitted when the FB signal trails the CLK signal—at the above second state of the clock pulse synchronization apparatus 1 ("second synchronization phase", FIG. 2)—causes the delay $t_{var}$ of the CLK signal imposed by the first signal delay apparatus 2a (not however the delay of the CLK signal imposed by the second signal delay apparatus 2b) to be correspondingly (and steadily) reduced (e.g. from T1=tcycl to T1''''', etc.)—the delay $t_{var}$ imposed by the second signal delay apparatus 2b remains constant (e.g. at T2=$t_{var,min}$)).

In this way it is achieved that the FB signal (and/or its positive (and negative) pulse flanks) trails the CLK signal (and/or its corresponding positive (and negative) pulse flanks) less and less.

The above steps (reducing and/or increasing the delay period imposed by the first delay apparatus 2a) where needed, is repeated until the CLK and the FB signals—e.g. with a delay period T1=T1$_{locked}$ imposed by the first delay apparatus 2a—are synchronized with each other.

If for instance the above control device 5 achieves the synchronization of the CLK and the FB signals with each other it is caused (e.g. by means of the above control device 5) that the delay period $t_{var}$ imposed by the second delay apparatus 2b is varied—step by step—(e.g. is increased or decreased), in particular in such a way that the delay period imposed by the second delay apparatus 2b then corresponds with the delay period imposed by the first delay apparatus 2a (so that the following applies: T1=T2 (e.g. T1=T1$_{locked}$=T2=T2$_{locked}$)).

This stepwise increasing and/or decreasing of the delay period $t_{var}$ imposed by the second delay apparatus 2b can for instance occur soon after a corresponding positive (or negative) flank of the FB signal, in particular for instance shortly after the CLK and FB signals—already approximately synchronized during the "first synchronization phase"—have changed to the same signal state.

The CLK, FB, and the DQS signals are then synchronized with each other, i.e. the clock pulse synchronization apparatus 1 is "locked", (whereby the CLK signal then always shows a positive flank at the same time as the FB-signal (and/or the CLK signal shows a negative flank at the same time as the FB signal).

Figure 3:
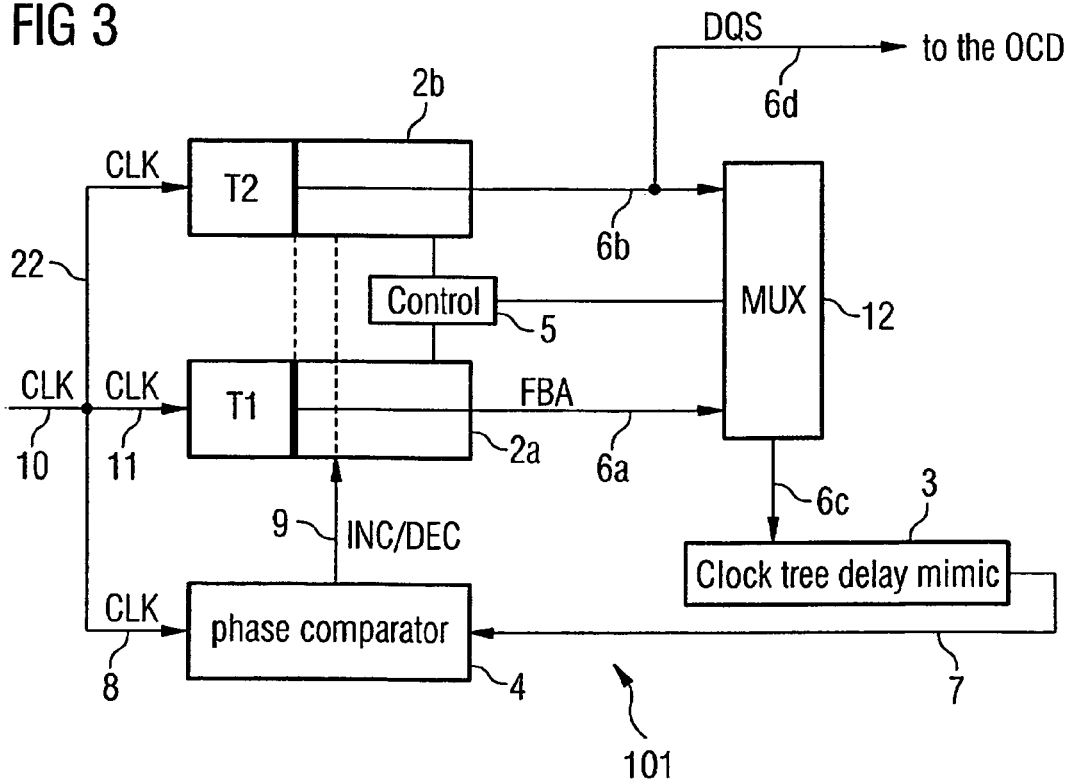
FIG. 3 shows a schematic representation of a clock pulse synchronization apparatus in terms of a further embodiment example of the invention.

FIG. 3 is a schematic representation of a version of a clock pulse synchronization apparatus 10—slightly modified in relation to the embodiment example shown in FIGS. 1 and 2.

It is correspondingly similar and/or identically constructed and functions correspondingly similar and/or identically to the clock pulse synchronization apparatus 1 shown in FIGS. 1 and 2, except that the clock pulse synchronization apparatus 101 shown in FIG. 3, has in addition been fitted with a multiplexer 12, which is connected—via the above line 6b—to the second delay apparatus 2b, and—via the above line 6a—to the first delay apparatus 2a, and is for instance—also—controlled by the above control device 5.

With the help of the multiplexer 12 (for instance controlled by the control device 5) and at the above first state of the clock pulse synchronization apparatus 101 ("first synchronization phase"), the above line 6a—connected to the first delay apparatus 2a—and the above line 6b—connected to the second delay apparatus 2b—are conductively connected to each other (as well as to line 6c, which is connected to the input of the further delay apparatus 3).

In this way—during the "first synchronization phase" (while the signal delays caused by the first and second delay apparatus 2a, 2b are identical)—the energy consumption of the clock pulse synchronization apparatus 101 can be reduced.

On entering into the above "second synchronization phase" with the aid of the multiplexer 12 (and for instance controlled by the control device 5) the connection of the above line 6a—connected to the above first delay apparatus 2a—and the above line 6b—connected to the second delay apparatus 2b—is severed again. The signal DQS emitted by the second delay apparatus 2b is then only relayed—via the line 6b—to a pulse output line (but not again to the further delay apparatus 3), and the signal FBA emitted by the first delay apparatus 2a is only relayed—via the lines 6a, 6c connected to the multiplexer—to the further delay apparatus 3 (but not again to the pulse output line 6d).

Upon entering into the above "locked" state, the above line 6a—connected to the first delay apparatus 2a—is then again conductively connected—in order to save energy—with the help of the multiplexer 12 (and for instance controlled by the control device 5)—to the above line 6b—connected to the second delay apparatus 2b—(as well as to the two lines 6a, 6b, connected to line 6c, which is connected to the input of the further delay apparatus 3).

What is claimed is:

1. A device for synchronization of clock pulses, comprising:
   a first delay apparatus for imposing a variably controllable delay on a clock pulse or a signal derived therefrom, an output of the first delay apparatus being used to control a phase comparator;
   a second, additional delay apparatus for imposing a variably controllable delay on the clock pulse or a signal derived therefrom, an output of the second delay apparatus being used to control an output of the clock pulse synchronization device; and
   a control device for varying the signal delay caused by the first apparatus and the signal delay caused by the second delay apparatus, wherein if the signal delay caused by the first or second delay apparatus exceeds or falls below a predetermined threshold value:
      i) the control device leaves the signal delay caused by the second delay apparatus at least temporarily unchanged, and
      ii) the control device varies the signal delay caused by the first delay apparatus stepwise.

2. The device according to claim 1, in which the clock pulse, or a signal derived therefrom, is input into the second delay apparatus with a variably controllable delay, which signal has a variably controllable delay imposed on it by the second delay apparatus, and is emitted as a delayed signal.

3. The device according to claim 1, in which the signal emitted by the second delay apparatus or a signal derived therefrom is used as a clock pulse for chronological co-ordination of the processing and/or relaying of data.

4. The device according to claim 1, in which the signal emitted by the first delay apparatus or a signal derived therefrom is used as feedback signal for the device.

5. The device according to claim 1, in which the signal emitted by the first delay apparatus or a signal derived therefrom is input into a further delay apparatus, which imposes a fixed delay on the input signal.

6. The device according to claim 1, wherein stepwise varying of the signal delay comprises:
   increasing or decreasing the signal delay by a cycle period of the clock pulses.

7. The device according to claim 1, wherein stepwise varying of the signal delay comprises:
   adjusting the signal delay to a value halfway between a maximum threshold value and a minimum threshold value.

8. The device according to claim 1, wherein stepwise varying of the signal delay comprises:
   adjusting the signal delay to an initial condition.

9. A method of processing a clock pulse comprising the steps of
   imposing a variably controllable delay on a clock pulse or a signal derived therefrom by means of a first delay apparatus, an output of the first delay apparatus being used to control a phase comparator;
   imposing a variably controllable delay on the clock pulse or a signal derived therefrom by means of a second, additional delay apparatus, an output of the second delay apparatus being used to control an output of a clock pulse synchronization device; and
   varying the signal delay caused by the first apparatus, and varying the signal delay caused by the second delay apparatus, wherein, when the signal delay caused by the first or second delay apparatus exceeds or falls below a predetermined threshold value:
      i) the signal delay caused by the second delay apparatus is left at least temporarily unchanged, and
      ii) the signal delay caused by the first delay apparatus is varied stepwise.

10. The method according to claim 9, further comprising:
    varying the signal delay imposed by the first and second delay apparatuses.

11. The method according to claim 10, wherein, when the signal delay caused by the first or second delay apparatus exceeds or falls below a predetermined critical limit, the signal delay imposed by the corresponding delay apparatus is at least temporarily left unchanged.

12. The method according to claim 11, wherein, when the signal delay imposed by the first or second delay apparatus exceeds or falls below the predetermined critical limit, the signal delay caused by a respective other one of the delay apparatuses is varied stepwise.

13. The process according to claim 9, wherein stepwise varying of the signal delay comprises:
    increasing or decreasing the signal delay by a cycle period of the clock pulses.

14. The device according to claim 9, wherein stepwise varying of the signal delay comprises:
    adjusting the signal delay to a value halfway between a maximum threshold value and a minimum threshold value.

15. The device according to claim 9, wherein stepwise varying of the signal delay comprises:
    adjusting the signal delay to an initial condition.

* * * * *